(12) United States Patent
Ballantine et al.

(10) Patent No.: US 6,274,465 B1
(45) Date of Patent: Aug. 14, 2001

(54) DC ELECTRIC FIELD ASSISTED ANNEAL

(75) Inventors: Arne W. Ballantine, Cold Spring, NY (US); John J. Ellis-Monaghan, Grand Isle, VT (US); Toshiharu Furukawa; Glenn R. Miller, both of Essex Junction, VT (US); James A. Slinkman, Montpelier, VT (US)

(73) Assignee: International Business Machines Corporataion, Armonk, NY (US)

( * ) Notice: Subject to any disclaimer, the term of this patent is extended or adjusted under 35 U.S.C. 154(b) by 0 days.

(21) Appl. No.: 09/538,309

(22) Filed: Mar. 30, 2000

(51) Int. Cl.$^7$ .................................................. H01L 21/04
(52) U.S. Cl. .................. 438/510; 438/659; 438/660; 438/514; 438/522; 257/442
(58) Field of Search .................... 438/510, 659, 438/660, 514, 522; 257/442

(56) References Cited

U.S. PATENT DOCUMENTS

| | | | |
|---|---|---|---|
| 5,290,731 | * 3/1994 | Sugano et al. ................. | 438/653 |
| 5,343,064 | * 8/1994 | Spangler et al. ................ | 257/350 |
| 5,407,847 | 4/1995 | Hayden et al. ................. | 437/44 |
| 5,412,242 | 5/1995 | Cahen et al. .................. | 257/442 |
| 5,508,216 | * 4/1996 | Inoue ........................... | 438/151 |
| 5,729,094 | * 3/1998 | Geis et al. .................... | 315/169.1 |
| 5,757,048 | * 5/1998 | Inoue ........................... | 257/344 |
| 5,773,337 | 6/1998 | Lee .............................. | 438/199 |
| 5,825,066 | 10/1998 | Buynoski ...................... | 257/345 |

\* cited by examiner

*Primary Examiner*—Tan T. Nguyen
*Assistant Examiner*—Reneé R. Berry
(74) *Attorney, Agent, or Firm*—Connolly Bove Lodge & Hutz; William D. Sabo

(57) ABSTRACT

A method for forming a desired junction profile in a semiconductor device. At least one dopant is introduced into a semiconductor substrate. The at least one dopant is diffused in the semiconductor substrate through annealing the semiconductor substrate and the at least one dopant while simultaneously exposing the semiconductor substrate to a DC electric field.

47 Claims, 11 Drawing Sheets

DC ELECTRIC FIELD ASSISTED ANNEAL

FIELD OF THE INVENTION

The present invention relates to a method and device for controlling the diffusion of dopants in a semiconductor substrate.

BACKGROUND OF THE INVENTION

As semiconductor device structure sizes shrink, greater and greater control must be excised to control the formation of the ever shrinking structures. The location and dimensions of the smaller and smaller structures require careful control to ensure proper placement. At the minute dimensions involved, small errors in misplacement and/or size of structures formed can result in non-functional or misfunctioning devices. Processes involved in semiconductor device manufacture require ever increasing levels of precision to create the desired structures.

SUMMARY OF THE INVENTION

The present invention concerns a method for forming a desired junction profile in a semiconductor device. At least one dopant is introduced into a semiconductor substrate. The at least one dopant is diffused in the semiconductor substrate through annealing the semiconductor substrate and the at least one dopant while simultaneously exposing the semiconductor substrate to a DC electric field.

The present invention also relates to a device for forming a desired junction profile in a semiconductor substrate. The device includes means for annealing a semiconductor substrate in which at least one dopant has been diffused. The annealing means includes at least one heat source. The device also includes means for producing a DC electric field and exposing the semiconductor substrate to the DC electric field simultaneous with the annealing.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1A:
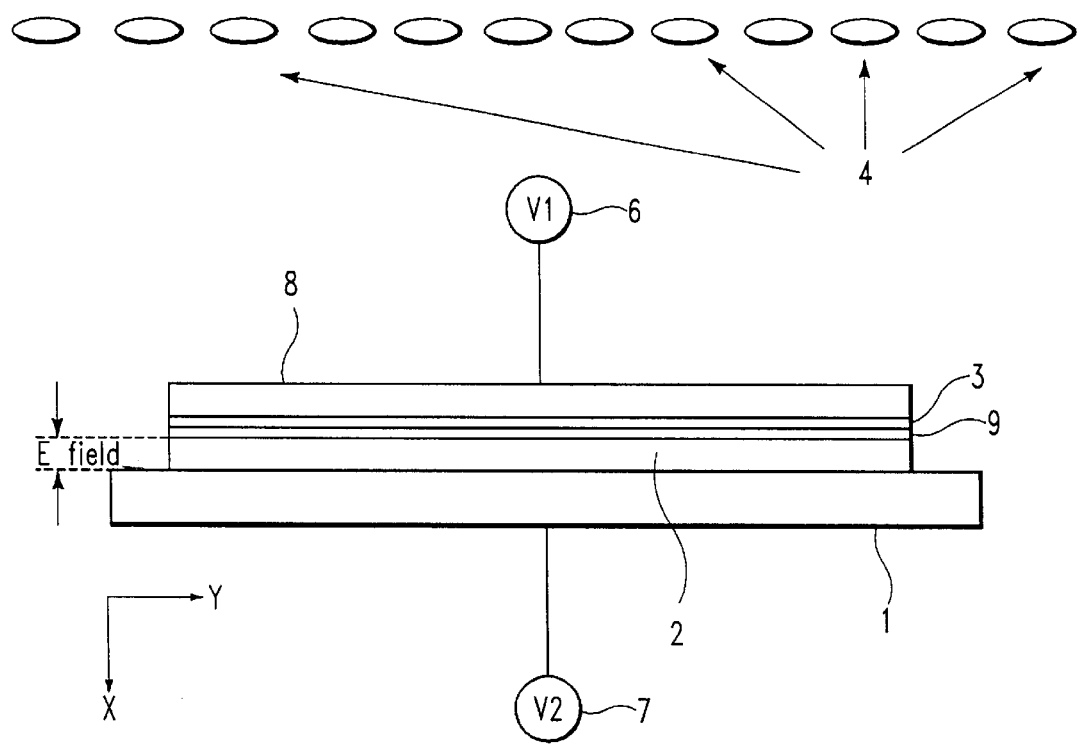
FIGS. 1a, 1b, 1c, and 1d represent cross-sectional views of four different embodiments of arrangements according to the present invention.

As semiconductor device structure size shrinks, it becomes increasingly difficult to create the smaller structures. One example of problems associated with formation of ever shrinking semiconductor devices relates to dopant diffusion. Along these lines, small devices can involve diffusion of dopants in a semiconductor substrate controllable to the minimum degree possible. In such a case, the problem becomes how to activate a dopant in order to form a shallow profile close to a semiconductor substrate surface without excessive diffusion of the dopants.

Currently, in order to form the shallow junctions in a silicon substrate required to build high performance silicon Complementary Metal-Oxide Silicon (CMOS) Field Effect devices, high performance bipolar devices and by precision resistors, rapid thermal anneal (RTA) tools are utilized in the semiconductor industry. These tools may include an array of hot lamps operated in an $O_2$, $H_2O$, $N_2$, $N_2O$, and/or Ar environment. Many process times useful for creating such junctions have been reduced to about 5 to about 20 seconds. Such short process times can be extremely difficult to control.

Furthermore, future integrated circuit designs and shallow source drain and extension implants will include shallower junctions. Process times needed to create such structure may be even shorter. It is anticipated that in view of the tolerances demanded by such short process, anneal times will be very difficult to achieve or maintain.

The present invention provides a process and apparatus for more controllable and more manufacturable production of such shallow junctions in an industrial RTA tool. With the present invention, the dopants may be activated to form the shallow junctions that are necessary now and in the future. Along these lines, the present invention permits control of dopant diffusion by retarding or enhancing the thermal diffusion on a local scale by means of an electric field "assist".

Broadly speaking, the present invention provides a method for forming a desired junction profile in a semiconductor device. At least one dopant is introduced into a semiconductor substrate, such as a silicon wafer. Any suitable method may be utilized for introducing the dopant(s) into the semiconductor substrate. Typically, ion implantation is utilized to introduce the dopant(s). The present invention may be useful in a variety of stages in the process of semiconductor device manufacture where dopant activation/diffusion takes place.

After introduction of the dopant(s) into the semiconductor substrate, the dopant(s) are activated through subjecting the semiconductor substrate and the dopant(s) to an annealing process. Simultaneous with the annealing, the semiconductor substrate and dopant(s) are exposed to a DC electric field.

In the context of the present invention, the anneal is typically carried out as a rapid thermal anneal (RTA). RTA and other rapid thermal processes are becoming widely used in semiconductor device manufacture to create certain structures. RTA processes typically include short process times, and particularly short times at a maximum temperature.

According to the present invention, the annealing may take place at a temperature of about 900° C. to about 1150° C.

The temperature of the substrate may be ramped up from about room temperature to a maximum processing temperature over a period of about 3 seconds to about 10 seconds. Typically, the temperature is ramped up to the maximum processing temperature as quickly as possible. The temperature may plateau one or more times during the time that the temperature is ramped up to the maximum, dwelling at the plateau(s) for a period of time.

Typically, the temperature is maintained at the maximum for a time of about 0.5 seconds to about 10 seconds. The temperature may remain at the maximum for one period of time or may dip below the maximum for one or more time periods, returning to the maximum.

After the desired processing time at the maximum temperature, the temperature of the semiconductor substrate is ramped down. Typically, the temperature is ramped down as quickly as possible. Along these lines, the temperature may be ramped down to about room temperature over a period of about 10 seconds to about 60 seconds.

Additionally, the annealing according to the present invention may take place for a time of about 0.5 seconds to about 10 seconds.

Also, the pressure that the annealing takes place at may vary. According to the present invention, the pressure within a rapid thermal processing tool may depend upon the DC electric field applied. Along these lines, the pressure may be reduced to help prevent arcing and/or electric discharge. This will be clarified below.

During the anneal, the present invention utilizes an applied DC electric field to control diffusion of the dopant (s). Controlling diffusion can include enhancing and retarding diffusion. In spite of the discussion above regarding forming extremely shallow junctions, in certain instances, it may be desirable to enhance diffusion of dopants. The diffusion of the dopant(s) may be controlled through control of the characteristics of the applied DC electric field, such as polarity, strength, and/or direction, or angle relative to the normal of the surface of the silicon wafer.

For example, the polarity of the DC electric field may be varied. The polarity of the DC electric field can depend upon the charge of the dopant(s) and the direction that it is desired to affect the movement of the dopant(s). For example, a positive DC electric field may be utilized to retard the diffusion of negative dopants. On the other hand, a positive DC electric field would enhance the diffusion of positive dopants. According to one particular example, if the implanted dopant species is As+, a negative field could be applied to attract the As+ atoms toward the surface. On the other hand, if the implanted dopant species is a negative ion, such as B−, a positive field could be applied to attract the distribution towards the surface. The strength of the applied field may be diminished by free carrier screening. Generally, the screening will be stronger for the case of enhanced diffusion.

The electric field is produced at least in the vicinity of the surface of the semiconductor substrate where the dopants have been introduced. If the semiconductor substrate is being subjected to an anneal and DC electric field in an upright position, then the field is produced at least at the upper surface of the semiconductor Substrate. The DC electric field typically extends into the semiconductor substrate. For dopant implants of a dose of about $10^{15}$ cm$^{-2}$, the screening depth, defined by 1/e field strength, is typically about 0.1 μm to about 0.2 μm. Controlling the characteristics of the DC electric field at locations in and on the semiconductor substrate will control the diffusion of the dopants.

Every portion of on and under the surface of the semiconductor substrate where the dopant(s) have been introduced may not be subjected to the DC electric field. Alternatively or additionally, regions on and under the surface of the semiconductor substrate where dopant(s) have been introduced may be subjected to DC electric field having varying characteristics. Along these lines, the field strength, direction, and/or other characteristics may differ, depending upon the region in or on the semiconductor substrate. Whether the DC electric field characteristics are the same over the entire surface or below the surface of the semiconductor substrate, the DC electric field characteristics may vary during the carrying out of a method according to the present invention.

It is not necessary that the annealing and exposure to the electric filed be carried out such that they always occur simultaneously. For example, there may be periods, however brief, during which a semiconductor substrate is annealed without exposure to the DC electric field. However, it is necessary to be at the anneal temperature in order that the electric field assist be effective. This is due to the constraints of thermodynamics embodied by the Einstein relationship between the field mobility of the activated dopant atom and its mass diffusion coefficient.

The following equations may be used to describe relationships among thermodynamics, mobility of the dopant species and the mass diffusion, among other factors.

In the equations, it is assumed that CGS units are being utilized. Local flux of dopant may be described by the following equation:

$$\vec{J}(x) = -D(C)\vec{\nabla}C(x) - Z \cdot \mu(x)C(x)\vec{E}(x)$$

wherein x is the distance from the surface of the wafer into the bulk of the wafer;

C(x) is the local number concentration (cm$^{-3}$) of the dopant ion species of interest;

Z is the charge state of the dopant ions;

q is the unit electronic charge;

k is Boltzmann's constant;

T is the wafer temperature in Kelvin;

D is the temperature dependent diffusion coefficient of the dopant species of interest in cm$^2$/sec;

E(x) is the applied electric field strength in V/cm; and

μ is the mobility of the dopant ion itself, not of the free carrier associated with it.

The Einstein relation between mobility and diffusion coefficient holds as usual (see S. M. Hu, "Diffusion in Silicon" in "Germaniu" in "Atomic Diffusion in Semiconductors", D. Shaw, (ed.) Plenum, London (1973), p. 294 ff.:

$$\mu(x) = (q/kT) \cdot D(x)$$

Then, the diffusion equation $$(\partial C(x)/\partial t) = \vec{\nabla} \circ \vec{J}(x)$$

for the dopant species becomes a drift-diffusion equation analogous to that encountered in modeling carrier transport:

$$(\partial C(x)/\partial t) = \vec{\nabla} \circ (D(x)\vec{\nabla}C(x)) + Z(q/kT)[\vec{\nabla} \circ (D(x)C(x)\vec{E}(x)]$$

Figure 4:
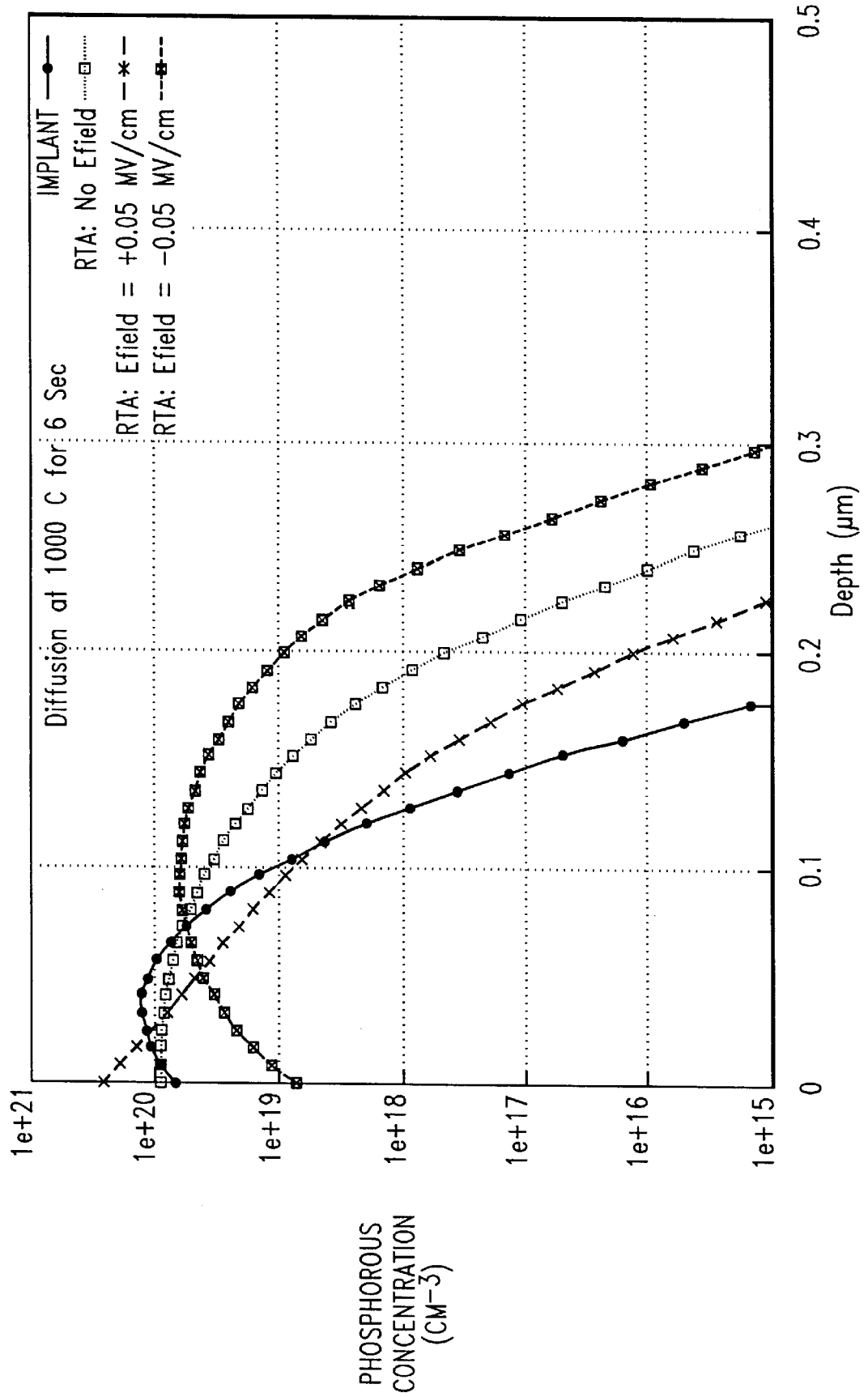
FIG. 4 represents a graph illustrating a relationship between phosphorus dopant concentration in a semiconductor substrate and depth within the semiconductor substrate.

FIG. 4 is a graph illustrating a relationship between phosphorus dopant concentration in a semiconductor substrate and depth into the substrate. Plotted are the implanted dopant profile and the profiles after an anneal at about 1000° C. for about 6 seconds at 0 applied DC field, and +/−0.05 MV/cm. It is noted that the positive field significantly retards the diffusion of the negative phosphorus ion, while the negative field enhances it. In principle, the DC field is screened strongly by the presence of free carriers in accumulation or inversion. This effect is not modeled here. However, for a field strength of 0.01 to 0.5 MV/cm, the carriers will be at worst in weak accumulation or weak inversion. Therefore, the screening effect is small and the above model is applicable.

According to some embodiments of a method according to the present invention, the DC electric field is produced normal to the surface of the semiconductor substrate. According to other embodiments, the DC electric field is produced at an angle with respect to the surface of the semiconductor substrate. Exposing the semiconductor substrate to a DC electric field normal to the surface of the semiconductor substrate can permit control of vertical diffusion of the dopant(s).

Lateral diffusion of the dopant(s) may also be controlled according to the present invention. One way to effect control of lateral diffusion of dopant(s) is to expose the semiconductor substrate to a DC electric field arranged at an angle to the surface of the semiconductor substrate. When utilizing a DC electric field that is at an angle with respect to the surface of the semiconductor substrate, diffusion of the dopant(s), for example, under the edge of a polysilicon FET gate, could be controlled.

This can, consequently, permit tuning of the FET device overlap capacitance (Cov).

The angle of the DC electric field with respect to the surface of the semiconductor substrate may vary, depending upon the degree of lateral diffusion desired. For example, a DC electric field at an angle of about 15° relative to the surface of the semiconductor substrate can produce a 25% effect laterally, relative to vertical. In principle, the field angle can vary from 0° to about 90° with respect to a line normal to the surface of the semiconductor substrate. According to such embodiments, the angle of the DC electric field with respect to the surface of semiconductor substrate is sufficient to result in the desired degree of modulation of the lateral diffusion of the dopant(s). However, practical considerations with respect to the proximity of the field source to the surface, herein described, may prevent the angle from exceeding $j_{max}=\tan^{-1}(h/r)$, where h is the height of separation of the field plate from the substrate at the center of the wafer, and r is the radius of the wafer. $J_{max}$ will typically be about less than about 5°.

Rotating the semiconductor substrate during the annealing and exposure to a DC electric field at an angle with respect to the semiconductor substrate can permit a uniform lateral effect, if desired. If the substrate is not rotated, the effect would be biased in the direction of the applied field. This may also be desirable in certain instances.

The DC electric field may be set up in a variety of ways. According to one example, the semiconductor substrate is arranged on an electrically conducting chuck that provides a source of electrical potential. The chuck may include a surface that lies adjacent and contacts the entire bottom surface of the semiconductor substrate, as illustrated in FIG. 1a.

Along these lines, FIG. 1a represents a cross-sectional view of one embodiment of an apparatus of the present invention. In the arrangement shown in FIG. 1a, a thin layer 3, on the order of about 20 nm to about 500 nm, of tungsten (W) metal has been deposited on a silicon wafer or field source wafer 8. The field source wafer 8 is aligned and brought into horizontal contact, or near contact, with the object silicon wafer 2, which is to be annealed. A thin layer of oxide 9, on the order of about 10 nm to about 100 nm, has been formed on metal layer 3 by the metalization process. The metal-oxide wafer, including field source wafer 8, metal layer 3 and oxide/quartz layer 9, forms one electrode of the DC electric field source. The underlying metal chuck 1 forms the other electrode. The desired field is generated by applying a DC bias of in the range of about 0 volts to about 5 volts between the electrodes. Additionally in FIG. 1a, a plurality of lamps 4 are arranged above the chuck 1 and supported wafers. Voltage sources V1 6 and V2 7 are connected to the field source wafer 8 and chuck 1.

Figure 1B:
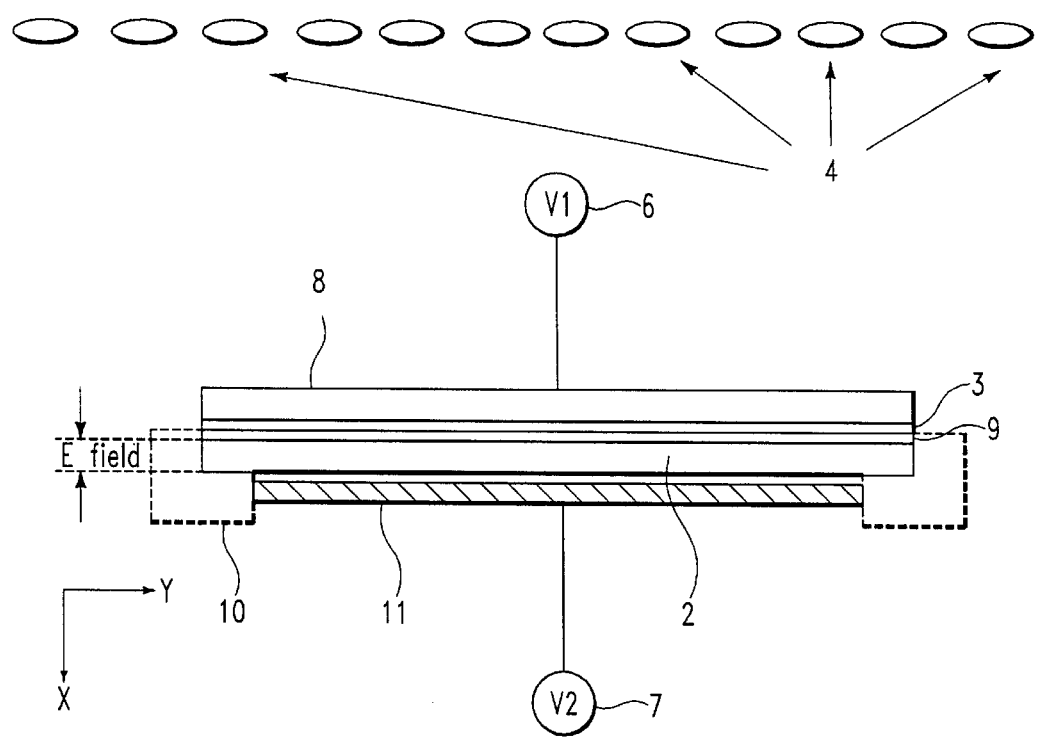
Figure 1C:
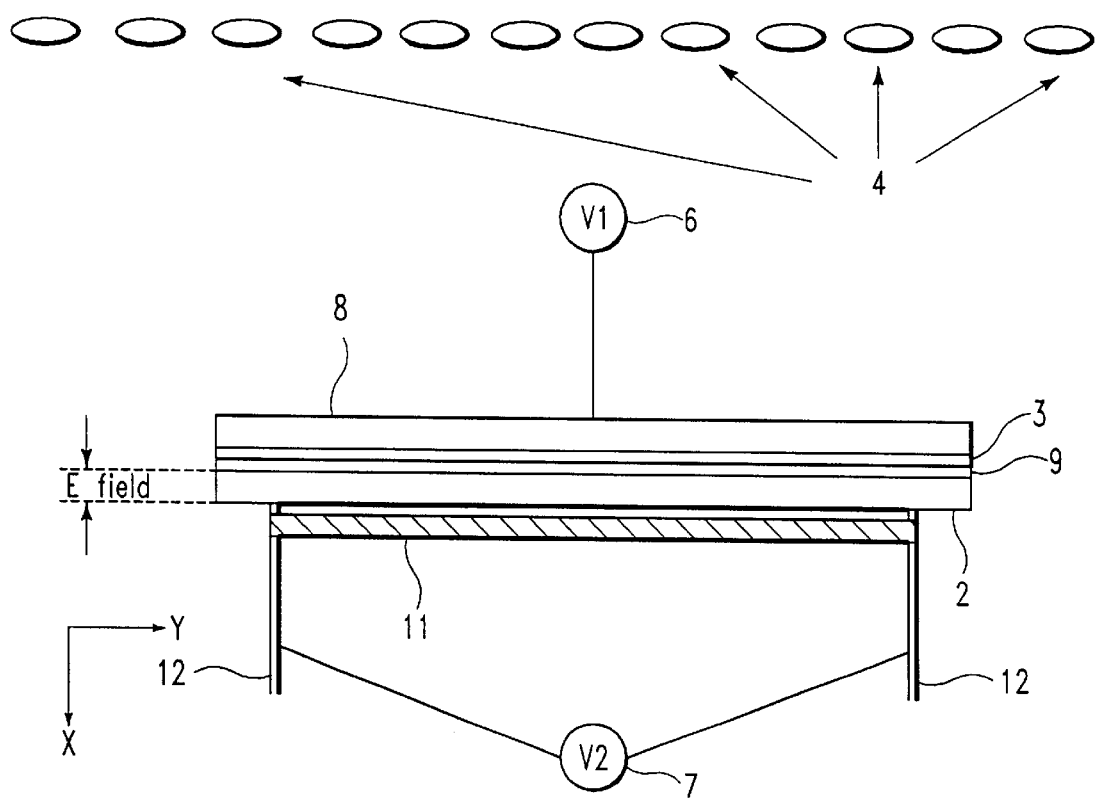

Alternatively, the chuck may include a portion that includes a surface that includes at least one passage that is open, exposing at least a portion of the semiconductor substrate. That is, the wafer may be mounted, for example, via its edge on an annular chuck, as shown in FIG. 1b, or by means of quartz pins, as shown in FIG. 1c, in a fashion well-known in the art. Along these lines, the chuck may include an annular portion that includes a large opening concentric with the annular portion. Such a large single opening could have a size about as large as the semiconductor substrate, such that the annular portion only engages the semiconductor substrate in the vicinity of the periphery of the semiconductor substrate.

FIG. 1b represents a cross-sectional view of another embodiment similar to the embodiment shown in FIG. 1a, except that the wafer is mounted on an annular metal chuck 10, which contacts only the periphery of the object wafer. The chuck also includes a substrate grid 11 attached to the chuck 10 under the object wafer 2. In this case the annular metal chuck forms the second electrode.

FIG. 1c represents a cross-sectional view of another embodiment similar to the embodiment shown in FIG. 1a. However, in FIG. 1c, the wafer is mounted horizontally on supporting pins 12. According to one embodiment, the pins are hollow quartz pins. Of course, the pins may be made of other materials and have other configurations. Typically, at least three or four pins support the wafer, two of which are shown in FIG. 1c. Tungsten wire may be fed through the pins if they are hollow. The wire may contact the backside of the object wafer, which can rest upon the pins, thus forming the second electrode. A grid 11 may be attached to the pins and electrically connected to the wires.

As shown in FIGS. 1b and 1c, the chuck or a body arranged under the object wafer includes a central portion that includes a plurality of perforations. Along these lines, FIGS. 1b and 1c illustrate a grid of electrically conducting material connected to the annular chuck member or wafer supporting pins. The semiconductor substrate can contact the grid when placed on the chuck or pins. The grid may be comprised of tungsten wire or other suitable metal or alloy that does not melt or degrade in the temperature range of interest for annealing. The grid may be similar to the grid discussed below arranged in the vicinity of but not in contact with the semiconductor substrate.

The chuck may comprise a clamp. The clamp may be included in the annular member described above. The annular clamp may be made of any suitable material. Typically, the annular clamp is made of metal. A metal clamp ring may provide electrical grounding potential for the DC electric field.

The part of the clamp that protrudes laterally onto the top surface of the object wafer typically protrudes no more than about 0.5 mm and vertically above the surface no more than about 0.25 mm. The lateral protrusion typically is sufficient to provide mechanical stability and good electrical contact but not enough to impede the electric field produced by the top electrode described below. The vertical protrusion typically is minimized such that the top electrode can be brought into close horizontal proximity to the clamped object wafer. A clamp, such as that described herein, typically cannot be used if the source electrode is to contact the object wafer.

Utilizing an annular clamp may be desirable to reduce thermal mass, thereby helping to maximize the thermal ramp-down of the semiconductor substrate temperature itself. To help ensure that distribution of the DC electric field when utilizing this configuration will be uniform in the wafer plane, a fine grid of wires, similar to the one described below as used for the other plate of the electrical field, could be arrayed in contact with the semiconductor substrate and the annular chuck ring. Such a grid of wires can help to generate a much more uniform DC electric field, and minimize added thermal mass.

Figure 1D:
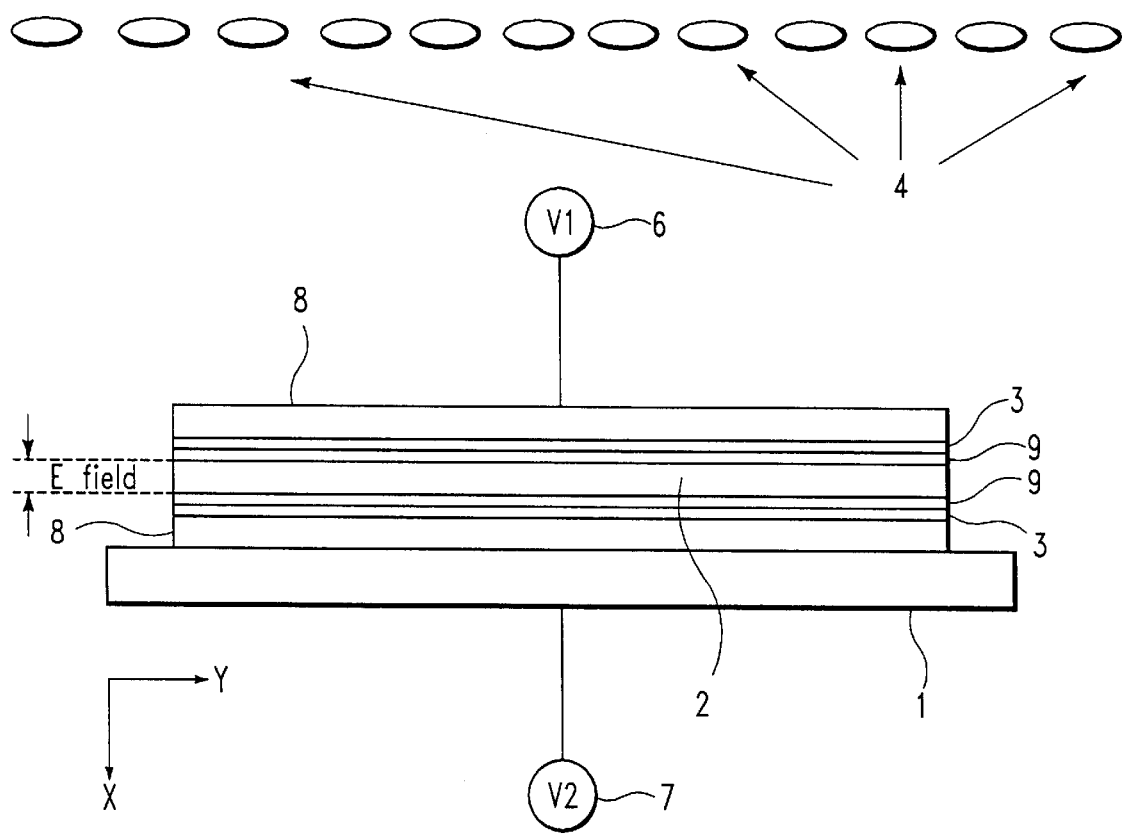

FIG. 1d shows yet another embodiment of the present invention wherein a field source wafer 8 is arranged on both sides of a object wafer. The object wafer sandwiched between the two field source wafers is arranged on the chuck 1. If it is desired to create a uniform field, then a field source wafer typically would be utilized.

Figure 2A:
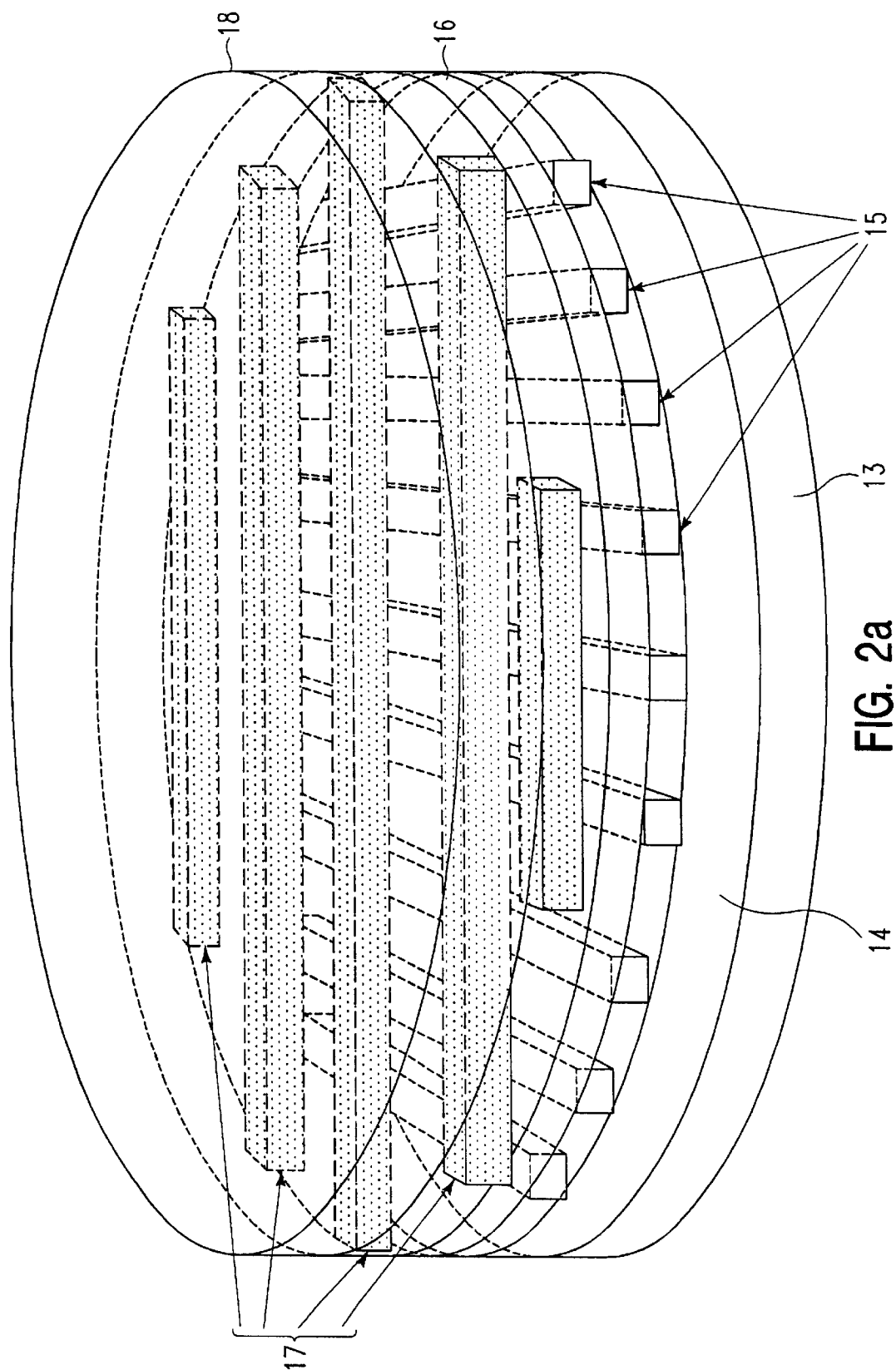
FIGS. 2a, 2b, 2c, and 2d represent overhead perspective views of four different embodiments of arrangements according to the present invention.
Figure 2B:
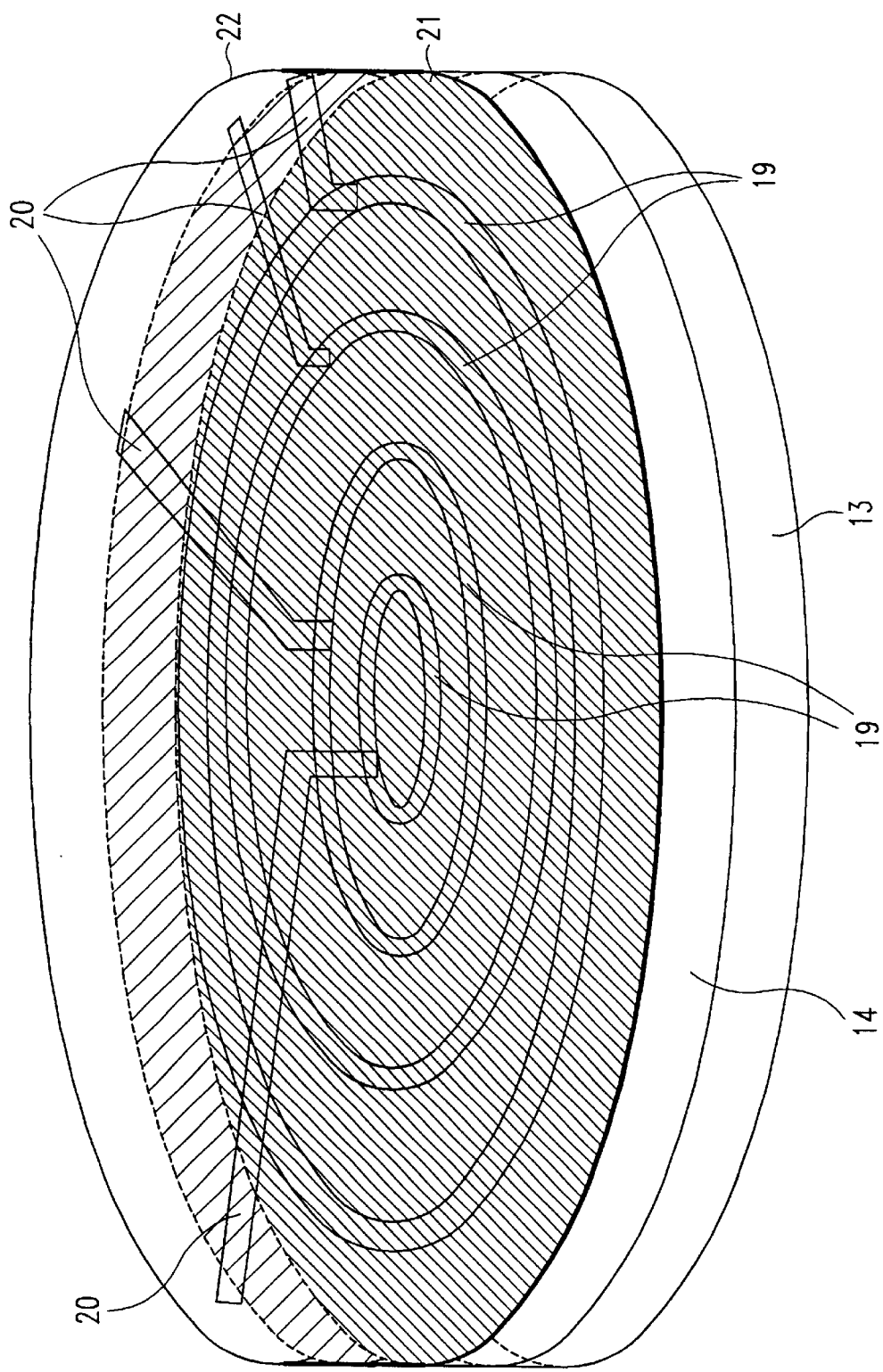
Figure 2C:
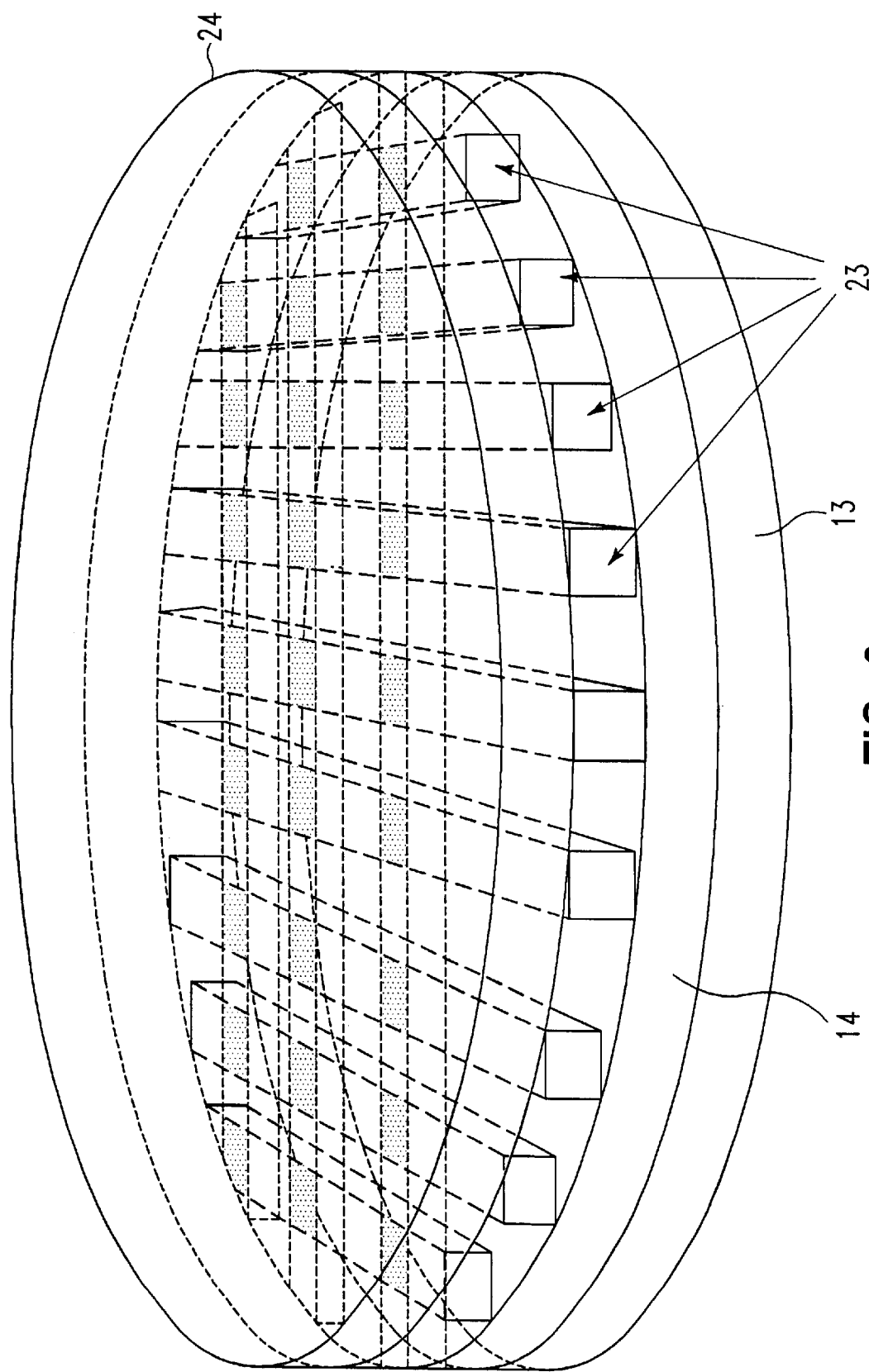

Generating the DC electric field can also include arranging a grid of an electrically conducting material such as wires illustrated in FIGS. 2a, 2b, and 2c, or a conducting plate, which could be comprised of a thin film of metal. If it is desired to create a spatially varying field, a grid field source typically would be utilized. The grid or plate typically is arranged adjacent to but not in contact with at least a portion of a surface of the semiconductor substrate. However, if the grid or plate is insulated with on oxide layer, contact is admissible, so long as there are protruding portions of a clamp, as described immediately above, which would prevent contact.

The grid, as the term implies, includes a plurality of passages therethrough. The grid passages are actual passages in the sense that the thermal radiation emitted the annealing lamps can pass through them with little attenuation. However, in the case where the top electrode is formed by the continuous metal-quartz/oxide layer stack, the thermal radiation is blocked directly from the object wafer. However, thermal conduction through the stack is known to take only about 0.5 sec to propagate through these layers to the object wafer, where some of the radiation is ultimately absorbed as useful heat for the dopant annealing, which is the object of the present invention.

The grid may be made of a suitable conducting material and may be configured in a grid-quartz or -oxide layer stack as illustrated in FIGS. 2a, 2b, and 2c. Typically, the metal or other suitable metal or alloy is immune from melting and/or warping at the desired annealing temperatures. According to one example, the grid is made of tungsten. Other suitable refractory metals and alloys that have a sufficiently high melting point include chromium (Cr), nickel (Ni), platinum (Pt), and titanium (Ti), and NiCr.

The first wire-grid level shown in FIG. 2a may be separated from the field source wafer substrate by a distance of about 10 nm to about 100 nm of deposited quartz or oxide. The first wire-grid level may comprise a pattern of parallel tungsten wires having a thickness of about 100 nm to about 500 nm. The width of the wires parallel to the plane of the wafer may be defined by the desired degree spatial variation of the applied DC electric field. However, it is typically desirable that the width is sufficient to permit a wirebond to an external wire, such as a tungsten or copper wire, at one end of each respective wire. These external wires may be connected to a DC voltage source for generating the DC electric field.

FIG. 2a represents a perspective view of an embodiment of an apparatus of the present invention, wherein the tungsten layer is patterned as a rectangular grid. A thin layer 14, such as on the order of about 100 nm, of quartz or oxide may be deposited on a bare silicon wafer 13. Deposition of the quartz or oxide layer 14 may be followed by formation of a layer of parallel tungsten wires 15. The wires may be formed by a simple masking process.

Another thin layer 16, such as on the order of about 100 nm, of deposited quartz or oxide may separate orthogonal columns 17 of tungsten wires formed in the same way. Contacts to the wires may be formed via wire bond. A further layer 18 of quartz or oxide may be deposited on the second wire grid level 17. The rows and columns can then be individually biased and form one electrode of the DC electric field source. The resulting field impinging on the object wafer may be controllably spatially varying in the plane of the object wafer. The backside of object wafer may be supported as illustrated in FIG. 1a, 1b, 1c, or 1d.

The wire-grid level itself may be formed by depositing tungsten metal of desired thickness, such as in the range described above, and then patterning the metal using standard mask and etch processes which are well known in the art. The second wire-grid level may be separated from the first by another approximately 10 nm to 100 nm of deposited quartz or oxide. This typically requires depositing quartz or oxide to a thickness of at least about the thickness of the wires plus the about 10 nm to about 100 nm extra to provide the spacing to the next level. Optionally, even more quartz or oxide can be deposited, but polished back to a desired thickness, as is well known in the art. The tungsten wires on the second level may then be formed in a manner similar to the first, but with the wires running orthogonal to the wires in the first layer. Another about 100 nm to about 500 nm film of oxide or quartz may be deposited over the second wire-grid level to passivate it to prevent shorting to the underlying wafer to be annealed, which will underlay this field-source wafer described above.

FIG. 2b represents a perspective view of another embodiment of a gird, wherein the grid is formed in an annular pattern. The annular grid 19 shown in FIG. 2b may be formed in analogous fashion to the rectangular grid of FIG. 2a. The base wafer 13, the annular wiring layer 19 and the radial wiring layers 20 may be separated by deposited films 21 and 22 of quartz or oxide. Connection between individual annuli and radii may be made with vias between the layers. Wire bonds may form contacts to the radial wires for DC biasing. Here the annular wires may be biased individually via the radial wires.

The radial grid, such as the embodiment shown in FIG. 2b, may be formed in a manner similar to that described above for the rectangular pattern, but with appropriate mask definition as is well known in the art.

FIG. 2c illustrates an embodiment that represents a simplification of the embodiment shown in FIG. 2a. In the embodiment shown in FIG. 2c, only one layer of tungsten wire 23 is used. A layer 24 of quartz or oxide may be arranged on top of the wire grid 23. The wires in the embodiment shown in FIG. 2c are patterned in a crosshatch fashion and are, therefore, connected at the wire intersections. Thus, the wires for a rectangular grid that when electrically biased are at an equipotential.

Figure 2D:
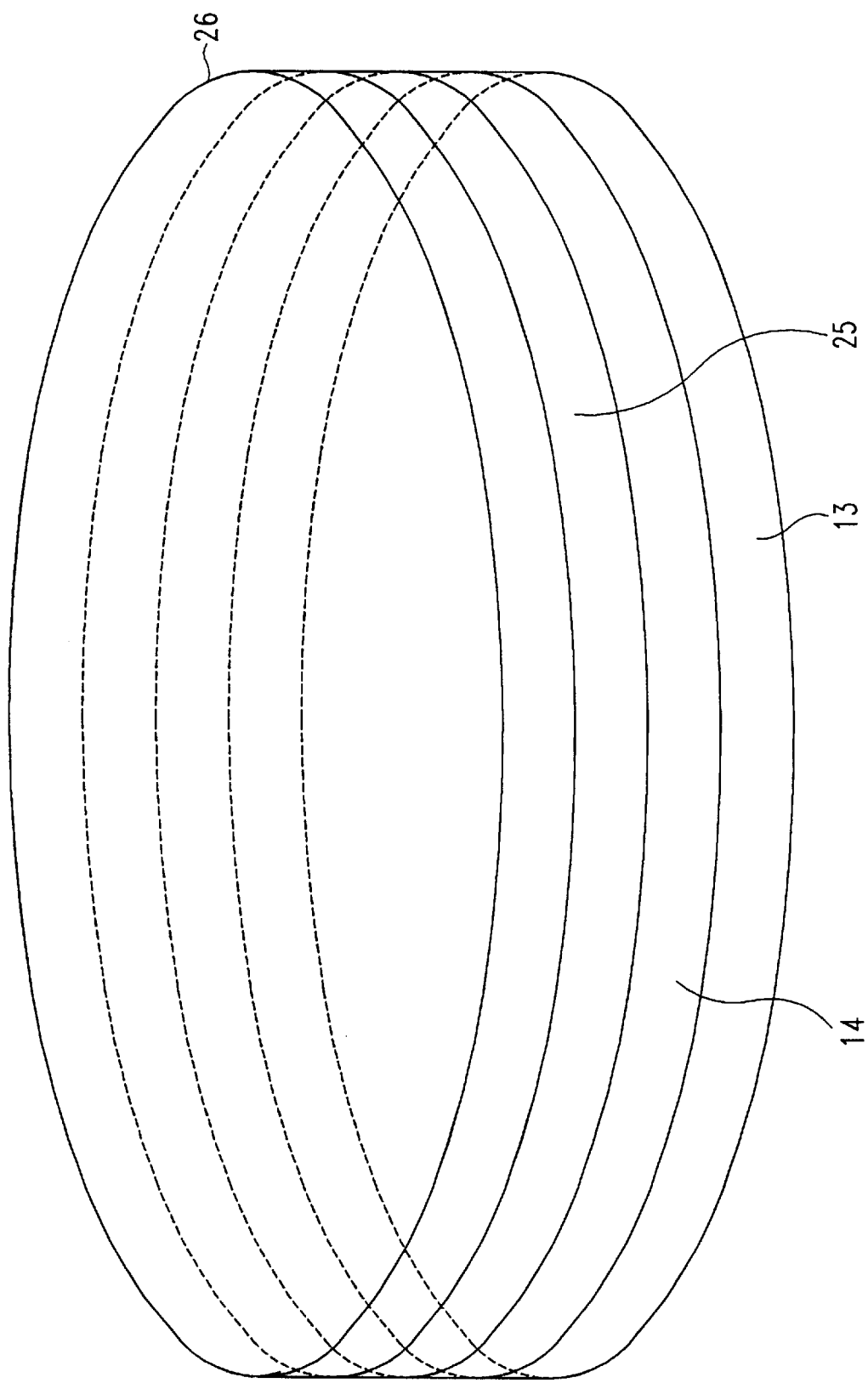

FIG. 2d illustrates an embodiment where the grid shown in FIGS. 2a, 2b, and 2c is replaced with a film 25. The film may be made of tungsten or any other suitable metal or alloy, such as those described herein. A layer 26 of quartz or oxide is arranged on top of the film 25.

The continuous metal film 25 shown in FIG. 2d may be formed via a simple variant of the above processes, which typically does not require patterning or a second layer of metal. However, this single metal layer typically must be passivated as described above to prevent shorting to the underlying wafer to be annealed.

A further variation of the present invention can include a screening layer that inhibits penetration of the applied DC electric field into the wafer being treated. The screening layer may comprise any material that can act to screen the wafer from the applied DC electric field. According to one embodiment, the screening layer comprises a metal layer metal deposited over an oxide layer. The metal layer may be thick. For example, the metal layer may have a thickness of more than 500 nm. Any suitable metal may be utilized. According to one example, the metal includes a tungsten film. A "field screen mask" as described above permits only selective areas of the object wafer to be subjected to the electric field anneal assist.

Figure 3:
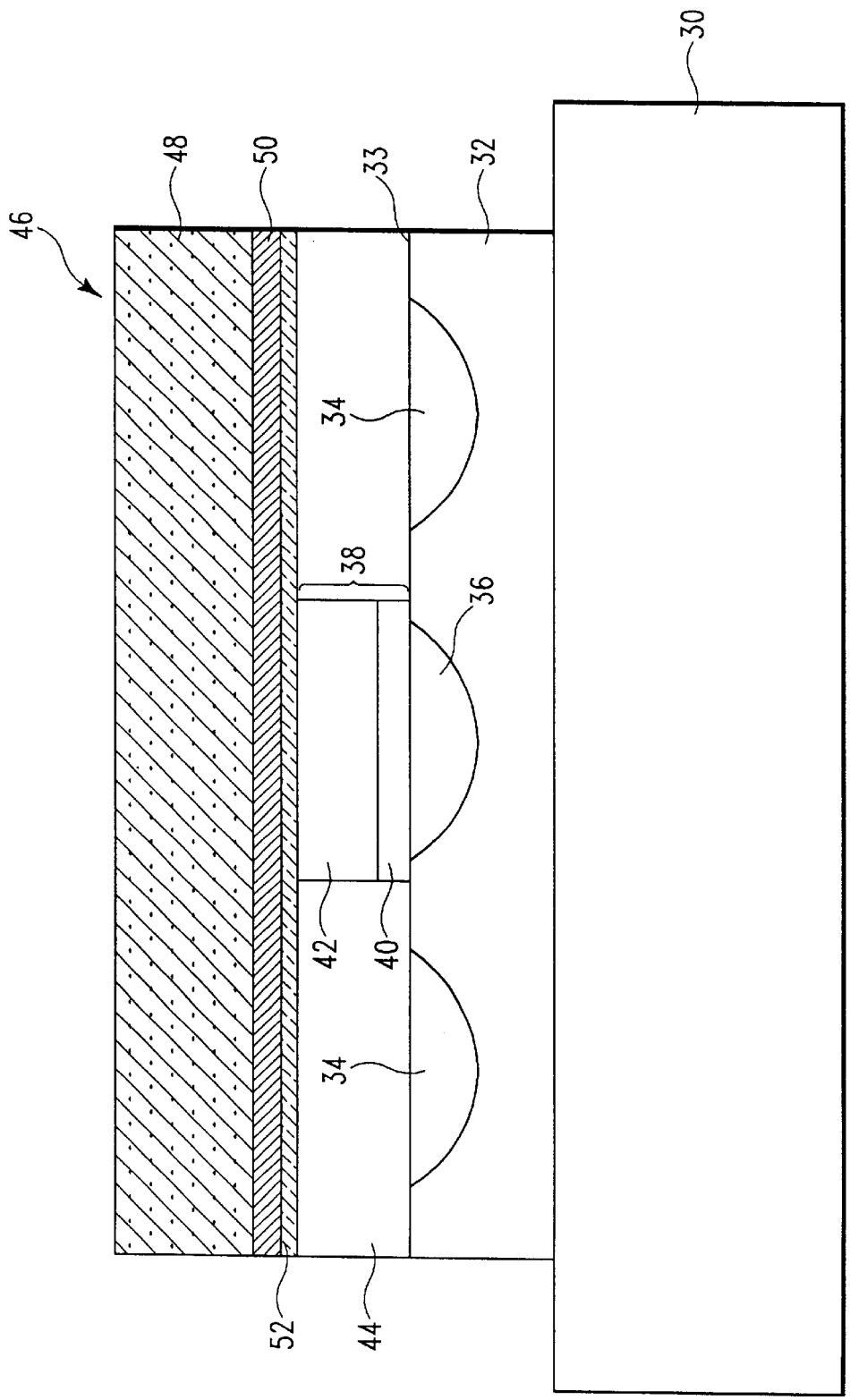
FIG. 3 represents a cross-sectional view of another embodiment of an arrangement according to the present invention.

FIG. 3 illustrates a cross-sectional view of a semiconductor substrate that includes a two-part field screen mask or sacrificial layer on the surface of the semiconductor substrate. Along these lines, FIG. 3 illustrates a chuck 30 on which a semiconductor wafer 32 has been arranged. Regions of the semiconductor substrate have been doped with phosphorus 34 and boron 36.

The sacrificial layer 38 is a two-part layer. Along these lines, the sacrificial layer includes an oxide layer 40 and a metal layer 42. The sacrificial layer is provided extending on the surface 33 of the wafer 32 beyond the edges of the boron region 36, but away from the phosphorus region 34. In FIG. 3, an optional layer 44 of quartz or oxide is shown on either side of the metal oxide masked boron-doped region. This provides a planar surface on which to contact or align the field source grid/metal stack 46.

The embodiment of the field source grid/metal stack shown in FIG. 3 comprises a wafer 48 with a layer 50 of tungsten metal 50 on the wafer and an oxide/quartz layer 52 on the metal layer. Such a field source wafer is described above in greater detail. The masking scheme shown in FIG. 3 includes the sacrificial metal layer that screens the applied field from the underlying dopant in the wafer, preferentially masking the boron, while the phosphorus is fully exposed to the full effects of the DC electric field assist.

The field-source grid/metal stack may be arranged over a portion of the surface of a semiconductor substrate. Alternatively, the field-source grid/metal stack may be arranged only over portions of a semiconductor substrate. The field-source grid/metal stack could actually be made up of a plurality of sub grids. Arranging the field-source grid/ metal stack or sub grids only over one or more selected portions of a semiconductor substrate could help to further control diffusion of the dopant(s).

The distance that the field-source grid/metal stack is arranged away from the semiconductor substrate may vary, depending upon the embodiment. As illustrated in FIGS. 1a, 1b, 1c, and 1d, the field-source grid/metal stack may be place in contact with the object wafer or may be arranged at a distance of about 100 nm to about 500 nm away from the semiconductor substrate. If the field-source grid/metal stack is arranged is in contact with the semiconductor substrate, then the topmost quartz or oxide layer, illustrated in FIGS. 2a, 2b, 2c, and 2d, may provide the necessary insulation to prevent electronic current flow through the object wafer during the field-assisted anneal.

To help refine distribution of the DC electric field, the field-source grid may include a plurality of individually biasable wires. Additionally or alternatively, the grid may include a plurality of subgrids. The subgrids may themselves include individually biasable wires. The grid, each biasable wire and/or each subgrid may be connected to a source of electric potential to generate a spatially varying DC electric field in the plane of the wafer, between the chuck/lower grid and the field source grid, for example, as shown in FIGS. 1a, 1b, 1c, and 1d. In the case of the field source consisting of the uniform metal film sandwiched between two insulating quartz/oxide layers, the DC electric field at the surface of the object wafer may be uniform in the plane of the object wafer.

Furthermore, electrical contact may be made to the grid or sub grids at a plurality of locations. Each location may be separately biasable. Depending on the desired layout of the grid, the grid-wire components can, in principle be individually contacted via a wiring layout achieved in a fashion well known in the art. This may serve to further refine the control of the DC electric field and, hence, the diffusion of dopants.

As stated above, the grid, regardless of its construction typically has a size sufficient to cover the entire surface of the semiconductor substrate. Such a grid can produce a constant DC electric field at the surface of the wafer and normal to it.

To generate a DC electric field normal to the surface of the semiconductor substrate, the field-source grid/metal stack is arranged parallel to the surface of the semiconductor substrate. If the DC electric field is to be at an angle to the surface of the semiconductor substrate then the grid and the substrate will be arranged at an angle relative to each other. As described previously, the angle may be restricted to be less than $J_{max}$.

The strength of the applied DC electric field may vary, depending upon the embodiment. One factor that may affect the field strength is the desired degree of enhancement or retardation of diffusion of dopants that is desired. Typically, the DC electric field will have a strength of about 0.01 MV/cm to about 1.0 MV/cm at the surface of the semiconductor substrate. For shallow junction semiconductor technologies, that is, for dopant pockets less than about 0.25 mm deep, it is well-known in the art that the annealing temperature is in the range of, typically, about 900° C. to about 1150° C. and annealing times are in the range of about 0.5 sec to about 10 sec. In this case, a field of magnitude +/−0.01 MV/cm is recommended in order to enhance/retard n+ dopant, such as phosphorus or arsenic, for example. The retardation/enhancement is reversed for p+ dopants, such as boron. Higher fields, such as on the order of about 0.1 to about 1.0 MV/cm, may be required to affect the diffusion/ annealing of dopants that have been implanted deep into the substrate. The field strength below the surface of the substrate of the object wafer may vary with depth into the substrate due to carrier screening. The field strength above and below the surface may actually vary.

As referred to above, the method according to the present invention may include varying and/or reducing the DC electric field strength on selected portions of the semiconductor substrate. The can permit local control of the diffusion of the dopant species. The DC electric field may be controlled in a variety of ways.

One way to control the DC electric field strength is to provide at least one sacrificial layer on at least one portion of a surface of the semiconductor substrate where the dopants have been implanted. Any material that can control the DC electric field strength may be utilized, which is immune to melting, degradation, and/or decomposition at the desired annealing temperature. Typically, the sacrificial layer reduces the DC electric field strength. The at least one sacrificial layer may include a metal layer. As previously mentioned, the refractory metals tungsten, chromium, nickel, platinum, and the alloy NiCr, are examples of such metals.

The at least one sacrificial layer may also include a layer of at least one dielectric material. The dielectric layer would lie on the surface of the semiconductor substrate between the metal layer and the semiconductor substrate. Any dielectric material may be utilized in the dielectric layer. Examples of dielectric materials that may be utilized in the at least one sacrificial layer include at least one nitride and/or at least one oxide. The sacrificial layer(s) may be applied with standard photolithography masking techniques.

The thickness of the dielectric layer may vary, depending upon the embodiment. Typically, the dielectric layer has a thickness of about 20 nm. More typically, the dielectric layer has a thickness of about 10 nm to about 100 nm.

Similarly, the thickness of the metal layer may vary, depending upon the embodiment. The typical thicknesses are described above.

The thickness and composition of the sacrificial layer are sufficient to result in the desired effect on the DC electric field.

One or more heat sources may be utilized for annealing the substrate and dopant(s). The heat source(s) may be arranged on an opposite side of the semiconductor substrate as the side that the dopant(s) have been introduced in. The side that the at least one heat source is arranged opposite may be opposite the grid as well.

Rather than utilizing a sacrificial layer, the field-source grid/metal stack could be engineered to lie in close proximity to the semiconductor substrate surface but without contacting it. The grid could further be engineered to be an array of much smaller grids which could be selectively activated, or biased, to produce the necessary field locally in desired regions of the wafer. Utilizing subgrids could even permit control on the scale of individual chips on a wafer. This could be extreme value in controlling wafer level excursions in device behavior arising from other sources.

The present invention also provides an apparatus for forming a desired junction profile in a semiconductor substrate. The apparatus according to the present invention may carry out the method described above. Along these lines, an apparatus according to the present invention includes means for annealing a semiconductor substrate in which at least one dopant species has been introduced. The annealing means includes at least one heat source.

FIGS. 1a, 1b, 1c, and 1d illustrate several different embodiments of the apparatus according to the present invention. The embodiment of the apparatus illustrated in FIG. 1a includes an electrically conducting chuck 1 supporting a semiconductor substrate 2, in this case, a semiconductor wafer. The chuck may be as described above. Along these lines, the chuck may comprise an annular ring that leaves the top and bottom surfaces of the object wafer exposed, as shown in FIG. 1b. Similarly, the chuck and, hence, the semiconductor substrate may rotate. Rotation can help to ensure uniformity of processing over the entire semiconductor substrate, if desired.

As illustrated in FIG. 1b, a wire grid 3 fabricated of electrically conducting material, such as one of the refractory metals referred to above, can be arranged within the annular chuck on the side opposite of the field-source grid/metal stack. This grid does not necessarily have to be in contact with the wafer. Alternatively, as illustrated in FIG. 1c, such a wire grid can underlie the object wafer in lieu of the chuck, but not necessarily be in contact with the wafer. In the latter case, as shown in FIG. 1c, the wafer may be supported on hollow quartz pins through which tungsten wire can be fed to provide contact to the DC potential source V2. FIG. 1d illustrates another embodiment wherein a duplicate field source gird/metal stack is mounted underlying the object wafer in lieu if the chuck or wire grid shown in FIGS. 1a, 1b, and 1c. In every case, the potential source V2 may be applied to the underlying chuck, grid, or field-source grid/metal stack.

A plurality of lamps 4 is arranged to provide heat to anneal the substrate and implanted dopant(s). The heat source(s) could be arranged anywhere about the chuck and supported semiconductor substrate. Along these lines, the heat source(s), such as the lamps illustrated in FIG. 1 could alternatively or additionally be arranged on the opposite side of the chuck as shown in FIG. 1. Arranging the lamps on the opposite side of the chuck as shown in FIG. 1 can make interference between the wire grid array and the device side, or top, of the wafer less likely.

However many heat sources are utilized, the heat sources may be capable of carrying out the processes described above.

To generate the DC electric field, both the grid 5 and the chuck 1, alone or together with the grid 3, may be connected to at least one voltage source 6 and 7, respectively. The voltage sources may be connected to the individually biasable wires or subgrids described above. The voltage sources generate the DC electric field between the grid 5 and the chuck/grid 3. The DC electric field in the embodiment illustrated in FIGS. 1a, 1b, 1c, and 1d is normal to the surface of the semiconductor substrate. As stated above, the grid and/or semiconductor substrate may be arranged such that they are at an angle with respect to each other to control lateral diffusion as well as vertical diffusion as well as the ratio of vertical to lateral diffusion, as shown in FIG. 5.

Figure 5:
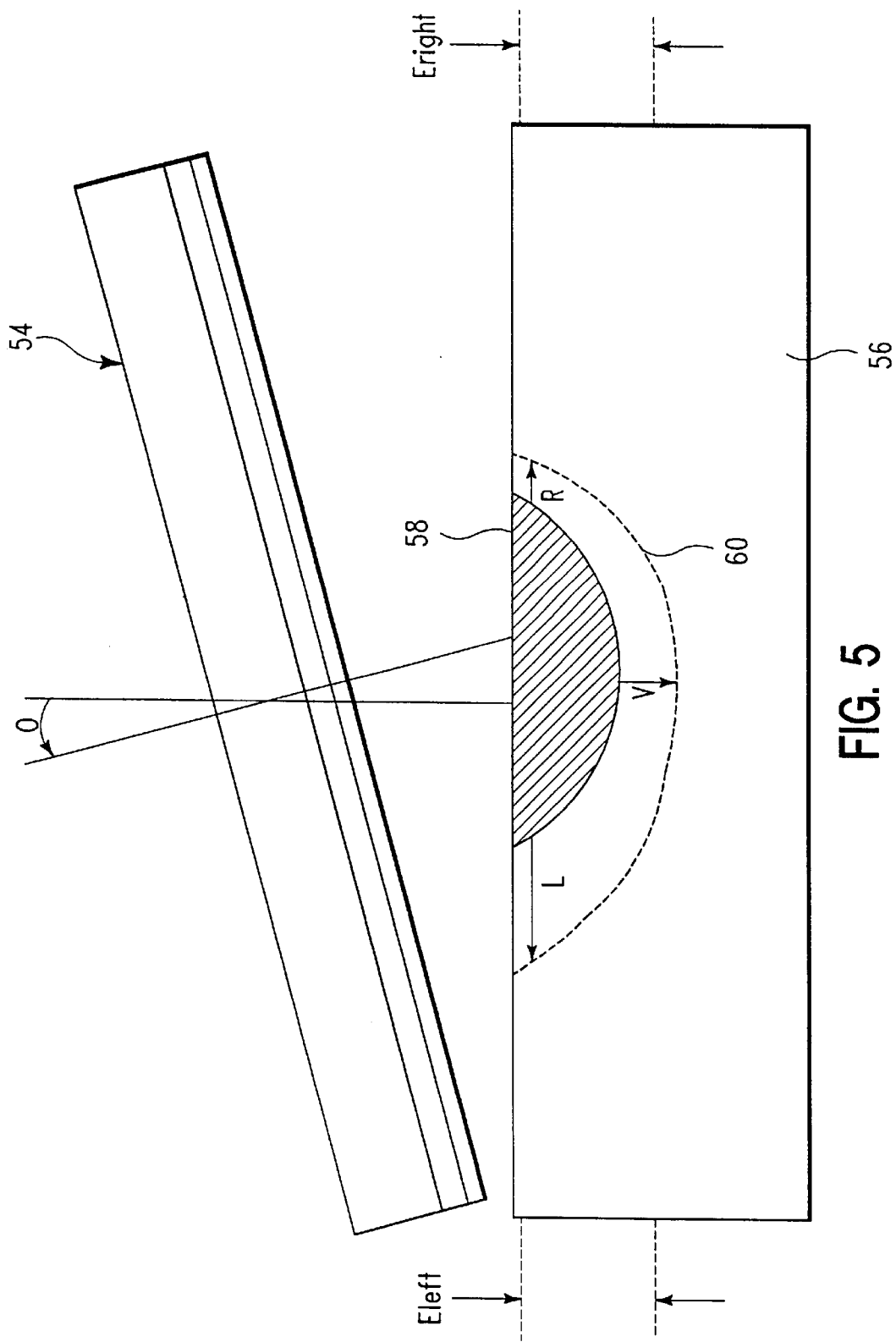
FIG. 5 represents a cross-sectional view of yet another embodiment of an arrangement according to the present invention.

FIG. 5 illustrates an embodiment wherein lateral diffusion is being carried out/controlled. For example, FIG. 5 shows the effect of tilting the field-source grid/metal stack 54 at an angle θ with respect to a line normal to surface of the object wafer 56. The resulting electric field in the object wafer 56 is, therefore, asymmetric, as shown in FIG. 5. Along these lines, the field is stronger on the left of the dopant pocket 58 than on the right. The out-diffused dopant profile 60 in two-dimensions is, therefore, asymmetric, having diffused a distance L on the left, which is farther on than the diffusion distance on the right R. With respect to the vertical out diffusion distance V, the ratio is, therefore, unequal left-to-right.

The chuck, lamps, grids, and other elements of the apparatus typically are provided in a processing chamber (not shown). Utilizing a processing chamber can permit control of all conditions within the processing chamber. Along these lines, an apparatus according to the present invention can include a pump for controlling the pressure within the processing chamber. The apparatus could also include at least one gas source for introducing any desired gases into the processing chamber.

In the embodiments illustrated in FIGS. 2a and 2c, contact to a desired potential source may be made to each individual wire in the grid via a wire bond at each end of the wire. Each potential source may have a unique strength, thus providing a spatially variable field in the plane of the surface of the object wafer. In the embodiment shown in FIG. 2b, each wire annulus on the first grid layer may be contacted via the radial wires on the second level.

Contact may be made through vias etched through the intervening quartz or oxide by means well known in the art. Wirebond contact to a potential source may be made at the free end of each of the radial wires. The potential source for each radial wire can be unique as in the embodiment represented in FIG. 2a.

In the embodiments illustrated in FIGS. 2a, 2b, and 2c, the metal grid film may be deposited on a film of oxide or quartz. The grid may be formed via masking techniques well known in the art. In the embodiments shown in FIGS. 2b and 2b, an intervening layer of quartz or oxide is deposited between the overlying second metal grid.

The embodiment shown in FIG. 2c does not include a second grid layer. Also, the embodiment represented in FIG. 2d does not include a grid. In both of the embodiments shown in FIGS. 2c and 2d, no intervening layer of quartz or oxide is necessary.

The electric field developed by the grid of FIG. 2c is, by definition, periodic in the plane of the object wafer. On the other hand, the electric field developed by the uniform film represented in FIG. 2d is uniform and constant, spanning the entire surface of the object wafer.

Advantages for local control of dopant diffusion on the object accrue given the variety of options presented by the above invention.

The strength of the DC electric field at the surface of the semiconductor substrate may vary. Typically, the DC electric field has a strength of about 0.01 MV/cm to about 1.0 MV/cm. The polarity depends upon the dopant type and is chosen so as to drive the ionized species to the surface creating the desired shallow junction or away from the surface in cases where diffusion enhancement is desirable. Fields greater than about 1.0 MV/cm may result in break down and/or damage to any thin gate oxide that may be present on the wafer. Typically, oxide with a thickness of less than 4.0 nm is considered "thin".

As stated above, the DC electric field strength may vary from above the surface to at the surface to below the surface of a semiconductor substrate. For example, in oxide on a silicon wafer, the electric field may have a value of about 3.9*E, where E is the applied field strength in air or vacuum. In the silicon itself, the field has a value of about 11.9*E.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for forming a desired junction profile in a semiconductor substrate, comprising:

introducing at least one dopant into a semiconductor substrate; and diffusing the at least one dopant in the semiconductor substrate through annealing the semiconductor substrate and the at least one dopant while simultaneously exposing the semiconductor substrate to a DC electric field.

2. The method according to claim 1, wherein the dopant is implanted by ion implantation.

3. The method according to claim 1, wherein the anneal is a rapid thermal anneal.

4. The method according to claim 1, wherein the DC electric field retards dopant diffusion.

5. The method according to claim 1, wherein the DC electric field enhances dopant diffusion.

6. The method according to claim 1, wherein the DC electric field is produced at an upper surface of the semiconductor substrate and normal to the upper surface of the semiconductor substrate.

7. The method according to claim 1, further comprising:

arranging the semiconductor substrate on an electrically conducting chuck that provides a source of electrical potential;

arranging at least one grid of an electrically conducting material adjacent at least a portion of a surface of the semiconductor substrate; and biasing the at least one grid and the electrically conducting chuck to create the DC electric field.

8. The method according to claim 1, further comprising:

arranging a field source wafer adjacent at least one surface of the semiconductor substrate; and biasing the field source wafer.

9. The method according to claim 7, wherein the grid is arranged over an entire upper surface of the semiconductor substrate.

10. The method according to claim 7, wherein the grid is arranged such that it is separated from the semiconductor substrate by a distance of about 100 nm to about 500 nm.

11. The method according to claim 7, wherein the grid comprises a plurality of individually biasable wires and the method further comprises individually biasing the wires.

12. The method according to claim 7, wherein the grid comprises tungsten.

13. The method according to claim 1, further comprising:

reducing the strength of the DC electric field on selected portions of the semiconductor substrate.

14. The method according to claim 13, wherein reducing the field strength comprises:

providing at least one sacrificial layer on portions of an upper surface of the semiconductor substrate to shield the at least one dopant from the DC electric field.

15. The method according to claim 14, wherein the at least one sacrificial layer comprises a metal layer on the portions of the upper surface of the semiconductor substrate.

16. The method according to claim 15, where in the sacrificial layer further comprises a layer of dielectric material on the upper surface of the semiconductor substrate between the metal layer and the semiconductor substrate.

17. The method according to claim 16, wherein the dielectric material comprises at least one of an oxide and a nitride.

18. The method according to claim 16, wherein the dielectric layer has a thickness of at least about 20 nm.

19. The method according to claim 15, wherein the metal layer has a thickness of greater than about 20 nm.

20. The method according to claim 7, wherein the grid is contacted at a plurality of locations and wherein each contact location is separately biasable.

21. The method according to claim 1, wherein the DC electric field has a strength of about 0.01 MV/cm to about 1.0 MV/cm at an upper surface of the semiconductor substrate.

22. The method according to claim 1, wherein the DC electric field is positive.

23. The method according to claim 1, wherein the DC electric field is negative.

24. The method according to claim 1, wherein the dopant comprises ions having a positive charge and the DC electric field is negative for attracting the ions toward an upper surface of the semiconductor substrate.

25. The method according to claim 1, wherein the dopant comprises ions having a negative charge and the DC electric field i s positive for attracting the ions toward an upper surface of the semiconductor substrate.

26. The method according to claim 1, wherein the method is carried out at a pressure of about 1 atmosphere or less.

27. The method according to claim 13, wherein reducing the strength of the DC electric field comprises:

arranging the semiconductor substrate on an electrically conducting chuck that provides a source of electrical potential;

arranging a grid of an electrically conducting material at a distance of about 100 nm to about 500 nm above at least a portion of an upper surface of the semiconductor substrate, the grid comprising a plurality of subgrids; and biasing the electrically conducting chuck and selectively biasing the subgrids to create the DC electric field.

28. The method according to claim 1, wherein lateral and vertical diffusion of the dopants is controlled with the DC electric field.

29. The method according to claim 1, wherein controlling lateral diffusion of the dopants comprises:

producing the DC electric field at an upper surface of the semiconductor substrate and at an angle with respect to an upper surface of the semiconductor substrate.

30. The method according to claim 29, wherein the DC electric field is at an angle of up to about 15° with respect to the upper surface of the semiconductor substrate.

31. The method according to claim 29, wherein the DC electric field is at an angle with respect to the upper surface of the semiconductor substrate sufficient to result in a desired degree of lateral diffusion of the dopants.

32. The method according to claim 30, further comprising:

rotating the semiconductor substrate during the annealing and exposing to the DC electric field.

33. The method according to claim 7, wherein a heat source for the annealing is arranged on a side of the semiconductor substrate opposite the grid.

34. The method according to claim 7, wherein the chuck comprises an annular clamp for clamping the semiconductor substrate and a grid of an electrically conducting material connected to the annular clamp.

35. The method according to claim 7, wherein the grid contacts the semiconductor substrate.

36. The method according to claim 7, wherein the grid is separated from the semiconductor substrate by a distance of about 100 nm to about 500 nm.

37. The method according to claim 1, wherein the annealing is carried out at a temperature of about 900° C. to about 1150° C.

38. The method according to claim 1, wherein the annealing is carried out for about 0.5 seconds to about 10 seconds.

39. The method according to claim 37, wherein the temperature of about 900° C. to about 1150° C. is maintained for about 0.5 seconds to about 10 seconds.

40. The method according to claim 37, wherein the temperature is ramped down to room temperature from the temperature of about 900°°C. to about 1150° C. over a period of time of about 10 seconds to about 60 seconds.

41. The method according to claim 1, further comprising:

controlling polarity, strength and direction of the DC electric field.

42. The method according to claim 8, wherein the field source wafer comprises a silicon wafer, one of a metal layer and a metal grid on the silicon wafer, and a layer of oxide or quartz on the metal layer or metal grid.

43. The method according to claim 1, further comprising:

arranging the semiconductor substrate on a plurality of supporting pins; and connecting a side of the semiconductor substrate supported by the pins to a voltage source.

44. The method according to claim 7, wherein a layer of quartz or oxide is arranged between the grid and the semiconductor substrate.

45. The method according to claim 7, wherein the grid comprises two grid layers.

46. The method according to claim 7, wherein the grid is annular.

47. The method according to claim 1, further comprising:

arranging a metal film adjacent at least one surface of the semiconductor substrate; and biasing the film.

* * * * *

UNITED STATES PATENT AND TRADEMARK OFFICE
CERTIFICATE OF CORRECTION

PATENT NO. : 6,274,465 B1
DATED : August 14, 2001
INVENTOR(S) : Arne W. Ballantine et al.

It is certified that error appears in the above-identified patent and that said Letters Patent is hereby corrected as shown below:

Column 7,
Line 23, change "a" to -- an --.

Column 8,
Line 45, change "gird" to -- grid --.

Signed and Sealed this

Twenty-sixth Day of March, 2002

Attest:

Attesting Officer

JAMES E. ROGAN
Director of the United States Patent and Trademark Office